(12) United States Patent
Suezawa

(10) Patent No.: US 8,433,077 B2
(45) Date of Patent: Apr. 30, 2013

(54) NOISE REMOVAL DEVICE AND NOISE REMOVAL METHOD

(75) Inventor: Takaaki Suezawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 944 days.

(21) Appl. No.: 12/385,793

(22) Filed: Apr. 20, 2009

(65) Prior Publication Data

US 2009/0262873 A1    Oct. 22, 2009

(30) Foreign Application Priority Data

Apr. 18, 2008   (JP) ................................ 108940/2008

(51) Int. Cl.
*H04B 1/10*    (2006.01)

(52) U.S. Cl.
USPC ............. 381/94.1; 381/94.6; 381/13; 381/14; 381/15; 381/16; 381/57; 381/94.7; 381/81; 704/225; 704/226; 375/296; 375/297; 375/305; 375/308

(58) Field of Classification Search ........... 381/1–4, 381/94.1–94, 6–7, 13–16, 57, 123, 94.7, 381/81; 455/296–297, 305, 308–309, 65; 375/346, 349, 340; 704/225–226
See application file for complete search history.

(56) References Cited

U.S. PATENT DOCUMENTS

| | | | | |
|---|---|---|---|---|
| 3,586,776 A | * | 6/1971 | Salava | 375/368 |
| 4,053,843 A | * | 10/1977 | Wright et al. | 455/224 |
| 4,648,127 A | * | 3/1987 | Jongepier | 455/212 |
| 4,701,715 A | * | 10/1987 | Amazawa et al. | 327/384 |
| 6,725,027 B1 | * | 4/2004 | Tsuji et al. | 455/296 |
| 6,788,923 B2 | * | 9/2004 | Tsujishita et al. | 455/223 |
| 7,269,237 B2 | * | 9/2007 | Taira | 375/346 |
| 7,430,255 B2 | * | 9/2008 | Shibuya et al. | 375/346 |
| 7,551,743 B1 | * | 6/2009 | Tsujishita et al. | 381/94.1 |

(Continued)

FOREIGN PATENT DOCUMENTS

| | | | |
|---|---|---|---|
| EP | 1860780 A | * | 11/2007 |
| JP | 52-117507 A | | 10/1977 |

(Continued)

OTHER PUBLICATIONS

Esquef et al, Interpolation of long Gaps in Audio Signals using the Warped Burg's method, DAFx 2003.*

(Continued)

*Primary Examiner* — Davetta W Goins
*Assistant Examiner* — Kuassi Ganmavo
(74) *Attorney, Agent, or Firm* — McGinn IP Law Group, PLLC

(57) ABSTRACT

The invention provides a noise removal device and method capable of more proper interpolation on an input signal. The noise removal device is for removing noise in an input signal and includes: a noise detector detecting noise in an IF signal and outputting a noise detection signal; an interpolation controller determining a period and amount of interpolation for noise correction processing, based on the IF signal and the noise detection signal; and a noise gate processor performing the noise correction processing on the IF signal, based on the interpolation period and amount supplied from the interpolation controller. The interpolation controller sets a predetermined first interpolation period, based on a first noise detection signal inputted from the noise detector, and redefines a second interpolation period longer than the first interpolation period when a second noise detection signal is detected within the first interpolation period.

7 Claims, 11 Drawing Sheets

U.S. PATENT DOCUMENTS

| | | | |
|---|---|---|---|
| 7,689,192 B2 * | 3/2010 | Saito | 455/296 |
| 7,793,202 B2 * | 9/2010 | Tashiro | 714/799 |
| 2004/0108906 A1 * | 6/2004 | Suganuma | 331/17 |
| 2008/0288094 A1 * | 11/2008 | Fukushima | 700/94 |

FOREIGN PATENT DOCUMENTS

| | | | |
|---|---|---|---|
| JP | 8-149098 A | | 6/1996 |
| JP | 08149098 A | * | 6/1996 |
| JP | 2004-56173 | | 2/2004 |
| JP | 2004056176 A | * | 2/2004 |
| JP | 2004187074 A | * | 7/2004 |
| JP | 2006101455 A | * | 4/2006 |
| WO | WO 2006098324 A | * | 9/2006 |

OTHER PUBLICATIONS

Japanese Notification of Reasons for Refusal dated May 29, 2012, with partial English-language translation.

* cited by examiner

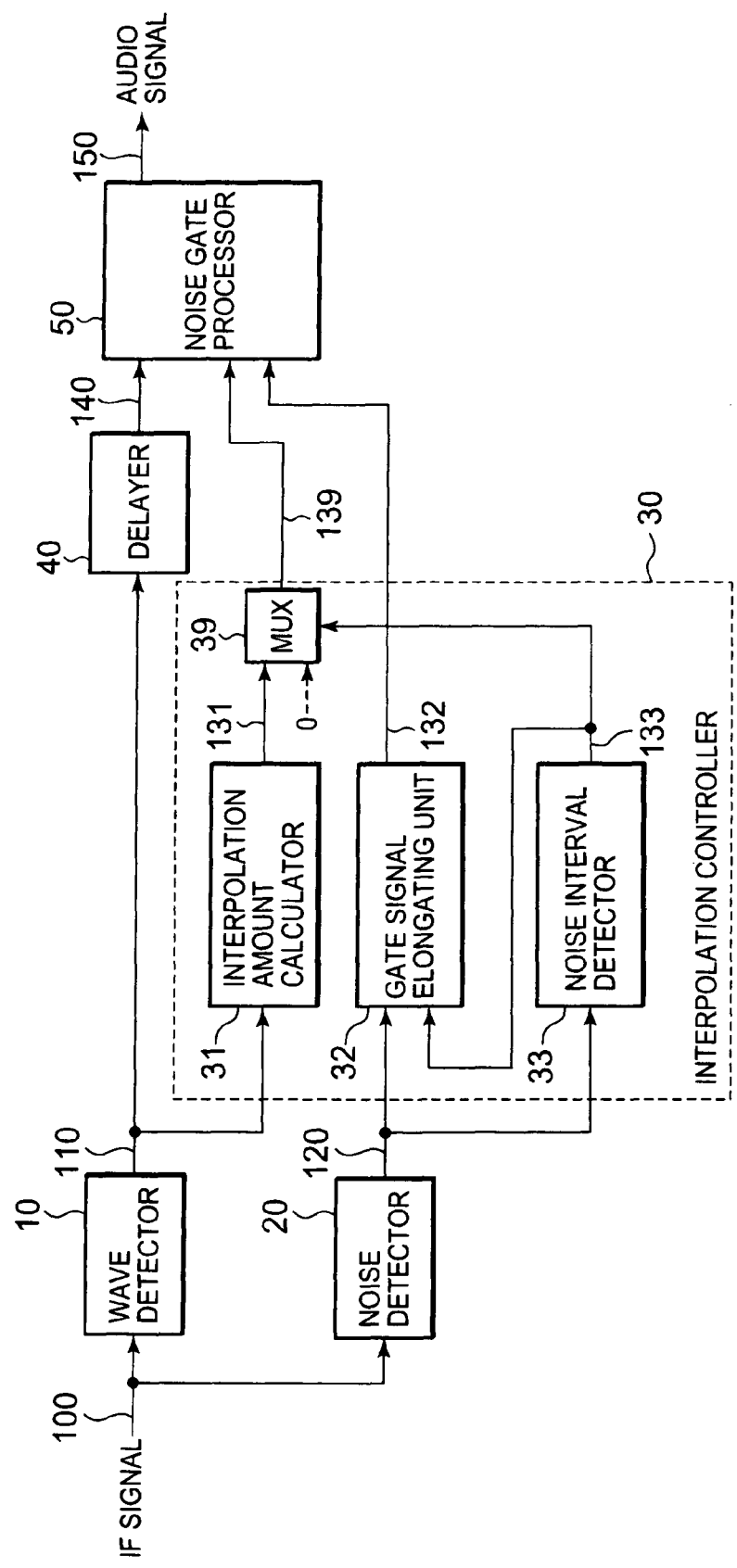

WAVE DETECTION SIGNAL (BEFORE NOISE CORRECTION PROCESSING)

NOISE DETECTION SIGNAL

NOISE GATE SIGNAL (BEFORE REDEFINITION)

NOISE DETECTION WITHIN INTERPOLATION PERIOD

NOISE GATE SIGNAL (AFTER REDEFINITION)

WAVE DETECTION SIGNAL (AFTER NOISE CORRECTION PROCESSING)

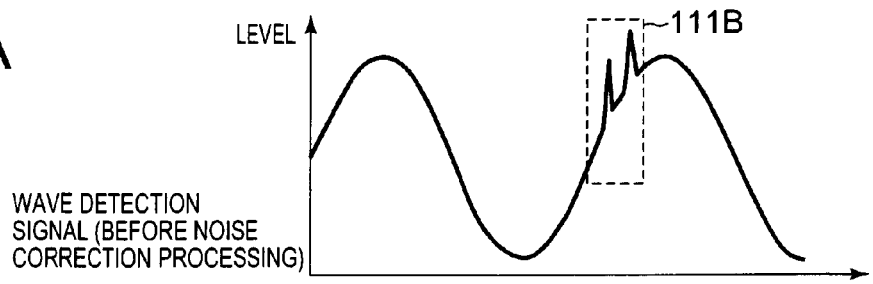

FIG. 3A  WAVE DETECTION SIGNAL (BEFORE NOISE CORRECTION PROCESSING)

FIG. 3B  WAVE DETECTION SIGNAL (BEFORE NOISE CORRECTION PROCESSING)

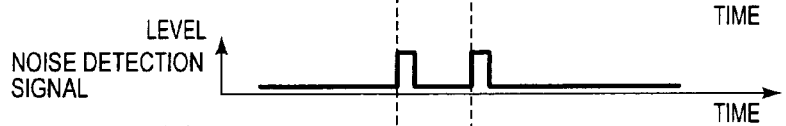

FIG. 3C  NOISE DETECTION SIGNAL

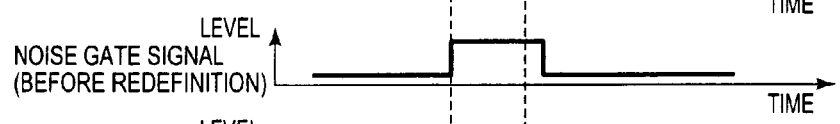

FIG. 3D  NOISE GATE SIGNAL (BEFORE REDEFINITION)

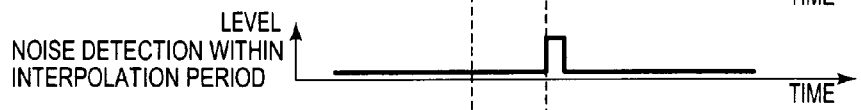

FIG. 3E  NOISE DETECTION WITHIN INTERPOLATION PERIOD

FIG. 3F  NOISE GATE SIGNAL (AFTER REDEFINITION)

FIG. 3G  DELAYED WAVE DETECTION SIGNAL (BEFORE NOISE CORRECTION PROCESSING)

FIG. 3H  NOISE GATE SIGNAL

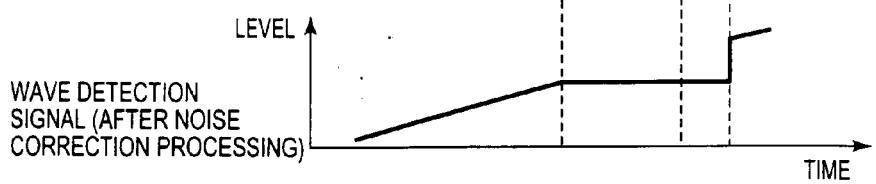

FIG. 3I  WAVE DETECTION SIGNAL (AFTER NOISE CORRECTION PROCESSING)

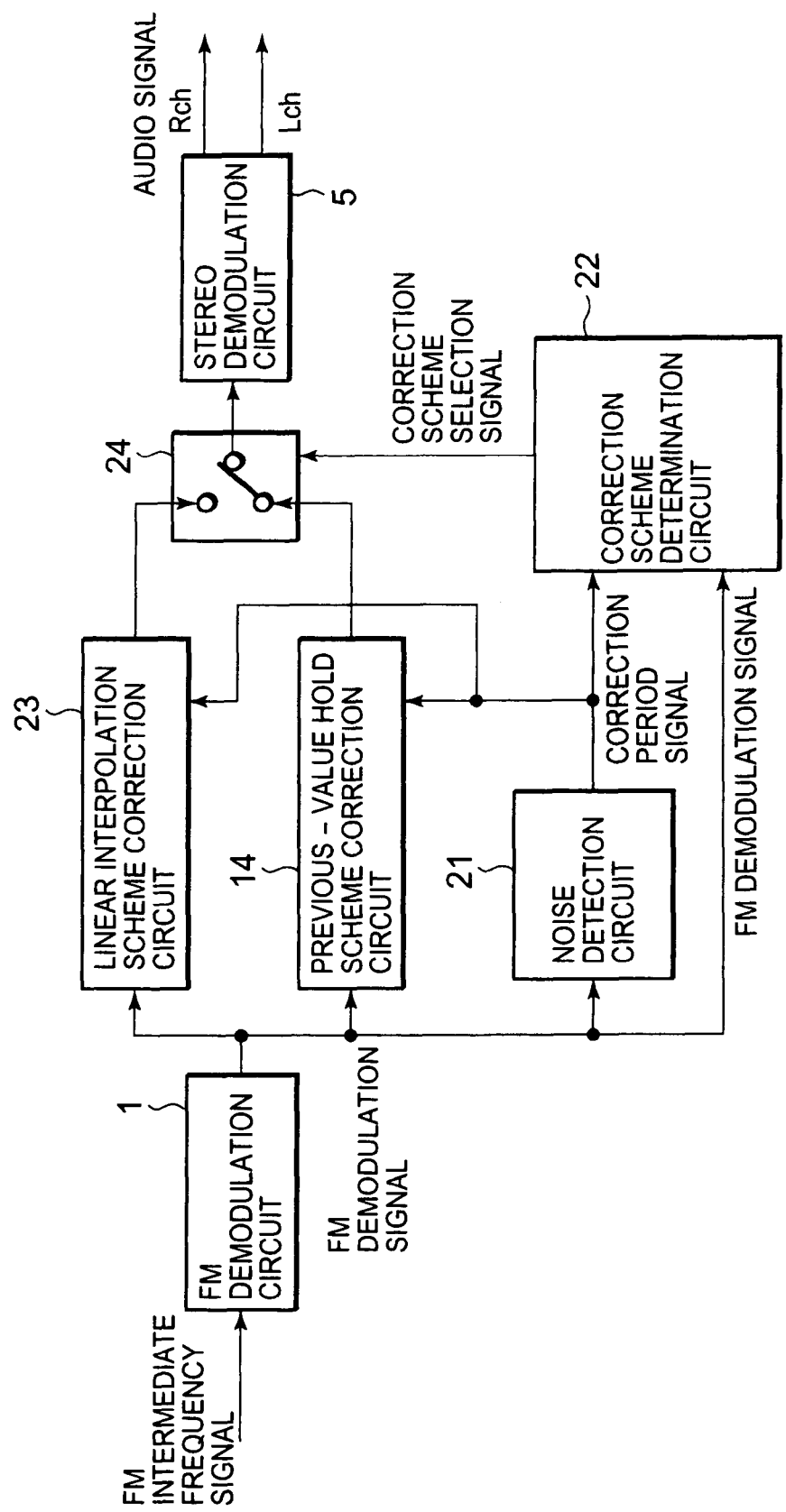

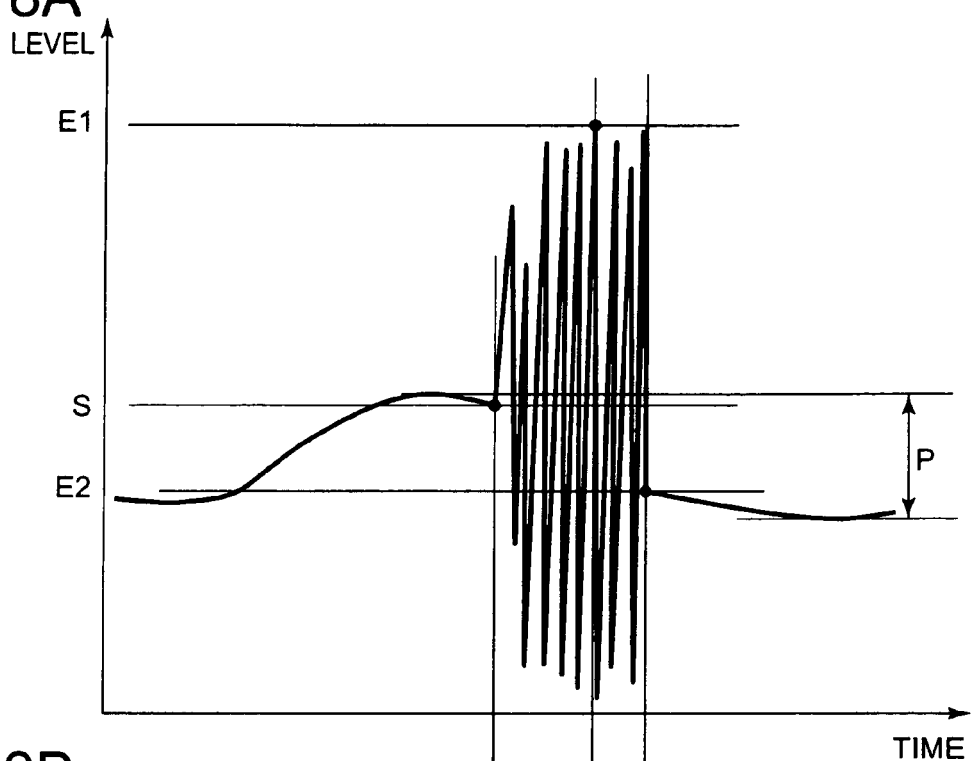
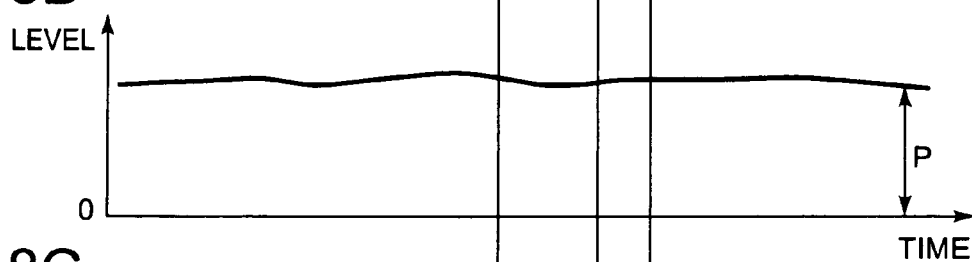
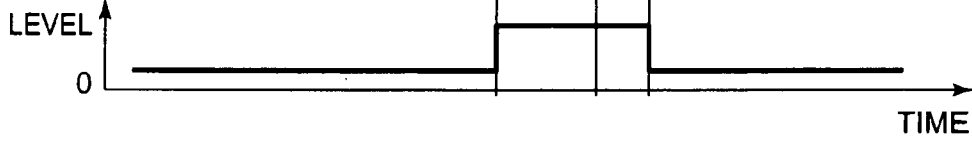

FM DEMODULATION
SIGNAL (BEFORE
NOISE PROCESSING)

FM DEMODULATION
SIGNAL AVERAGE
AMPLITUDE

CORRECTION
PERIOD SIGNAL

FM DEMODULATION
SIGNAL (AFTER NOISE
PROCESSING)

FM DEMODULATION SIGNAL (BEFORE NOISE PROCESSING)

FM DEMODULATION SIGNAL (BEFORE NOISE PROCESSING)

NOISE DETECTION SIGNAL

CORRECTION PERIOD SIGNAL

NOISE PERIOD DETECTION SIGNAL

DELAYED FM DEMODULATION SIGNAL (BEFORE NOISE PROCESSING)

CORRECTION PERIOD SIGNAL

FM DEMODULATION SIGNAL (AFTER NOISE PROCESSING)

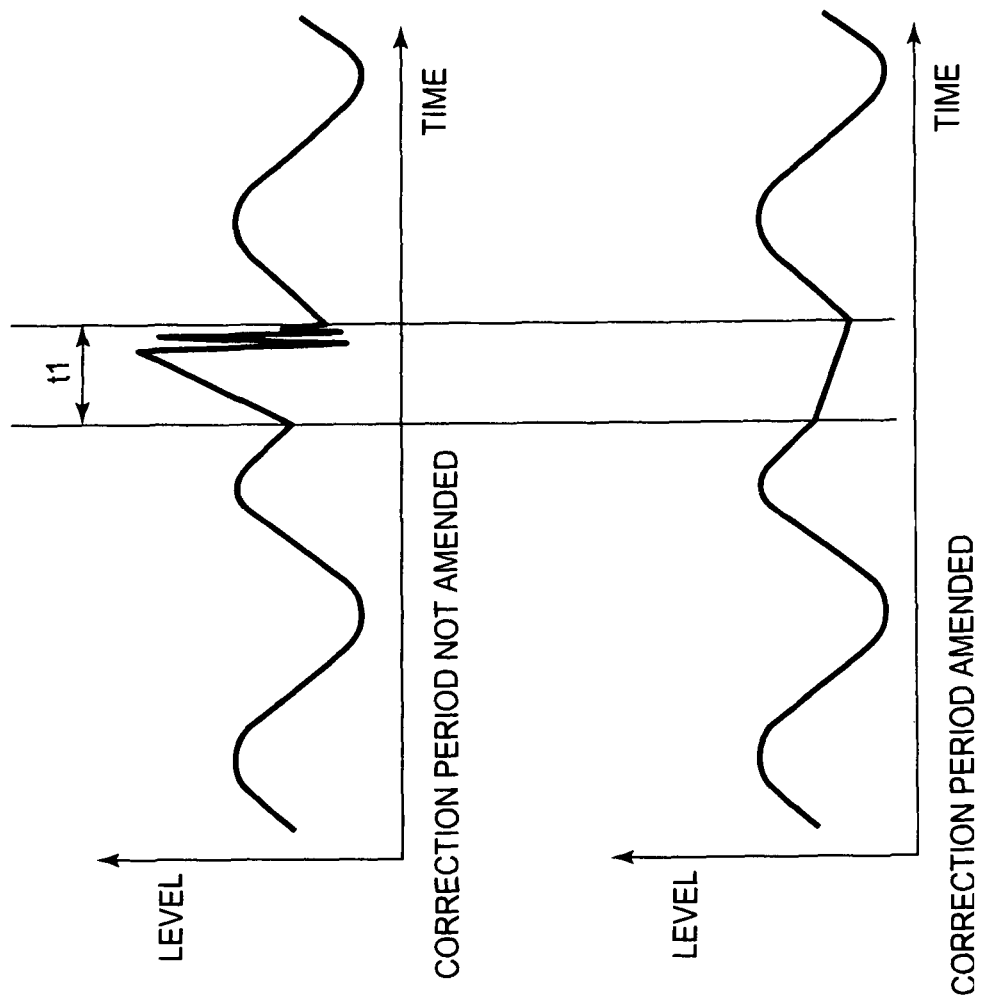

NOISE REMOVAL DEVICE AND NOISE REMOVAL METHOD

BACKGROUND OF THE INVENTION

1. Field of the Invention

The present invention relates to a noise removal device and a noise removal method, and more specifically, to a noise removal device and a noise removal method for removing noise generated in a radio receiver.

2. Description of the Related Art

In an in-vehicle radio receiver, when pulse noise such as ignition noise generated by the engine of a vehicle gets into an in-vehicle radio receiver, the audio quality of a radio signal received by the radio receiver is deteriorated. For this reason, the radio receiver is provided with a noise removal device for removing such pulse noise from a reception signal.

In the noise removal device, correction is performed on an audio signal in which noise is generated, by using a scheme such as a previous-value hold scheme or an interpolation scheme between two known points (linear interpolation scheme). In the linear interpolation scheme, the point at which noise is detected is set as a start point, and the point after a predetermined correction period from the start point is set as an end point. Then, the audio signal between these two points is interpolated. In the linear interpolation scheme, the correction period is generally determined in advance so as to facilitate processing for calculating a correction amount. However, when the period in which noise is generated is long, the noise cannot be reduced satisfactorily with the linear interpolation scheme. This is because of the following reasons.

Even though pulse noise is generated for a long period, a signal for the predetermined correction period (hereinafter, simply referred to as a correction period signal) may be shorter than the actual noise generation period. FIGS. 6A and 6B show examples of noise correction performed by using the linear interpolation scheme and by using the previous-value hold scheme, respectively, when the correction period signal is shorter than the pulse-noise generation period. As shown in FIG. 6A, when the linear interpolation is performed on an audio signal including pulse noise of a period t1 by using the correction period signal shorter than the period t1, the pulse noise is included in a value at the end point of the correction period used for the linear interpolation. As a result, not only satisfactory correction fails to be performed, but a large correction error might even result. A possible way to avoid this is to perform the previous-value hold scheme, as shown in FIG. 6B, on the audio signal so that the correction error can be made small.

To solve the problem caused by a mechanism employing only the linear interpolation scheme, Japanese Patent Application Publication No. 2004-056173 (referred to as Patent Document 1 below) discloses a technique of switching between the linear interpolation scheme and the previous-value hold scheme. FIG. 7 is a block diagram of a conventional noise removal device disclosed in Patent Document 1. The conventional noise removal device includes an FM demodulation circuit 1, a stereo demodulation circuit 5, a previous-value hold scheme correction circuit 14, a noise detection circuit 21, a correction scheme determination circuit 22, a linear interpolation scheme correction circuit 23, and a switch circuit 24.

In FIG. 7, the noise detection circuit 21 detects a noise generation period from an FM demodulation signal outputted from the FM demodulation circuit 1, and outputs a correction period signal. Based on the correction period signal and the FM demodulation signal, the correction scheme determination circuit 22 determines a correction scheme. When the correction period signal is determined as shorter than the actual noise generation period, the switch circuit 24 switches output from the linear interpolation scheme correction circuit to output from the previous-value scheme correction circuit 14. Then, the output from the previous scheme correction circuit 14 is converted into an audio signal by the stereo demodulation circuit 5.

As mentioned above, when a correction period signal is shorter than a pulse-noise generation period, the previous-value hold scheme causes less adverse effects on correction than the linear interpolation scheme. For this reason, in Patent Document 1, the correction scheme determination circuit 22 determines whether the correction period signal is shorter or longer than the pulse-noise generation period. Then, the correction scheme determination circuit 22 outputs a correction scheme selection signal selecting the previous-value hold scheme when the correction period signal is shorter, and outputs a correction scheme selection signal selecting the linear interpolation scheme when the correction period signal is longer.

Using FIGS. 8A to 8D, a detailed description will be given of how the correction scheme determination circuit 22 performs determination. When, as shown in FIG. 8C, a correction period signal is shorter than a pulse-noise generation period in an FM demodulation signal shown in FIG. 8A, pulse noise exists in the FM demodulation signal at an end point of the correction period signal. This causes a large difference between values of the FM demodulation signal at a start point and the end point of the correction period (|S−E1|). In contrast, when the correction period signal properly matches the pulse-noise generation period as shown in FIG. 8D, a difference between values of the FM demodulation signal at the start point and the end point of the correction period (|S−E2|) is smaller than an average amplitude level of the FM demodulation signal. Based on this, the correction scheme determination circuit 22 determines that the correction period signal is shorter than the pulse-noise generation period when a difference between the start point and the end point (|S−E|) is larger than an average amplitude P of the FM demodulation signal shown in FIG. 8B.

The conventional noise removal device is designed based on the assumption that the main noise source of the vehicle is ignition noise having a pulse noise generation interval of one to several ms or more. For this reason, it is sometimes difficult for the noise removal device of Patent Document 1 to handle high frequency pulse noise having short cycles, such as noise generated from a door mirror drive motor or a hazard flasher. Specific cases are described below.

For example, consider a case of performing noise correction processing on a signal including pulse noise having small amplitude as shown in FIG. 9A. In this case, even when the correction period signal shown in FIG. 9C is shorter than the pulse-noise generation period, a difference between the start point and the end point of a correction period |S−E| is smaller than the average amplitude level P of the FM demodulation signal shown in FIG. 9B. Consequently, the correction scheme determination circuit 22 wrongly determines that the correction period signal is longer than the pulse-noise generation period, and therefore selects the linear interpolation scheme. As a result, the FM demodulation signal after the noise correction processing has a waveform in which the start point and the end point of the correction period for the noise correction processing are connected. Accordingly, a large correction error is caused. Under the policy of selecting the interpolation scheme based on the average amplitude of the FM demodulation signal as in the above way, the linear interpolation scheme might be wrongly selected if the amplitude of the noise is small, even when the correction period signal is shorter than the pulse-noise generation period.

In addition, a description will be given of a case of performing the noise correction processing on an FM demodulation signal including pulse noise events successively at a short interval as shown in FIG. 10A. FIG. 10B is an enlarged waveform diagram of the portion XB in FIG. 10A. Further, FIGS. 10C to 10E show a waveform diagram of a noise detection signal, of a correction period signal, and of a noise period detection signal, respectively.

For example, when the interval between two pulse noise events is nearly equal to (the same as or shorter than) a preset correction period as shown in FIGS. 10B to 10D, the detected noise generation period indicates as if the noise were already finished at the end position of the noise correction processing, as shown in FIG. 10E. Accordingly, the correction scheme determination circuit 22 wrongly determines that the correction period signal is longer than the pulse-noise generation period, and therefore selects the linear interpolation scheme. As a result, the delayed FM demodulation signal shown in FIG. 10F has a waveform in which the start point and the end point of the correction period are connected as shown in FIG. 10G. Consequently, a large correction error is caused. When the interpolation scheme is selected based on the state of the end point of the correction period, proper correction cannot be performed for noise events included successively at a short interval.

Furthermore, the pulse-noise generation period and the correction period are compared; therefore, as shown in FIG. 11A, a noise event after the end point of the correction period cannot be corrected. Patent Document 1 discloses a method for revising the correction period by applying the detection result of the noise generation period to the correction period as shown in FIG. 11B. However, a proper correction period cannot be obtained with this revision method when the above-described correction period signal is shorter than the pulse-noise generation period, or when the signal includes pulse noise events successively at a short interval. As described, in some cases, correction cannot be performed on a noise event that occurs after the correction period.

SUMMARY

The present invention seeks to solve one or more of the above problems, or to improve upon those problems at least in part.

In one embodiment, a noise removal device includes: a noise detector that detects noise in the input signal and outputs a noise detection signal; an interpolation controller that determines a period and an amount of interpolation for noise correction processing, based on the input signal and the noise detection signal; and a noise gate processor that performs the noise correction processing on the input signal, based on the interpolation period and the interpolation amount supplied from the interpolation controller. In this noise removal device, the interpolation controller sets a predetermined first interpolation period, based on a first noise detection signal inputted from the noise detector, and redefines a second interpolation period longer than the first interpolation period when a second noise detection signal is detected within the first interpolation period. With the above configuration, the noise removal device can revise the noise interpolation period when a new noise event is detected within the interpolation period.

In second embodiment, a noise removal method includes: detecting noise in the input signal and outputting a noise detection signal; generating a noise gate signal for a predetermined interpolation period by elongating the noise detection signal; redefining the interpolation period and generating the noise gate signal for the redefining interpolation period when a new noise detection signal is detected while the noise gate signal is being outputted; and performing noise correction processing on the input signal in accordance with the interpolation period and an interpolation amount determined based on the interpolation period. By the above method, the noise interpolation period can be revised when a new noise event is detected within the interpolation period.

According to the present invention, a noise removal device and a noise removal method by which more proper interpolation can be performed on an input signal.

BRIEF DESCRIPTION OF THE DRAWINGS

FIG. 1 is a block diagram showing the configuration of a noise removal device according to Embodiment 1.

FIGS. 3A to 3I each show another timing diagram of the noise removal device according to Embodiment 1.

FIG. 7 is a block diagram of a conventional noise removal device.

FIGS. 8A to 8D are diagrams explaining the operation of a correction scheme determination circuit in the conventional noise removal device.

FIGS. 11A and 11B are diagrams explaining a correction period signal and linear interpolation performed based on a revised correction period signal, respectively.

DESCRIPTION OF THE PREFERRED EMBODIMENTS

Figure 2A:
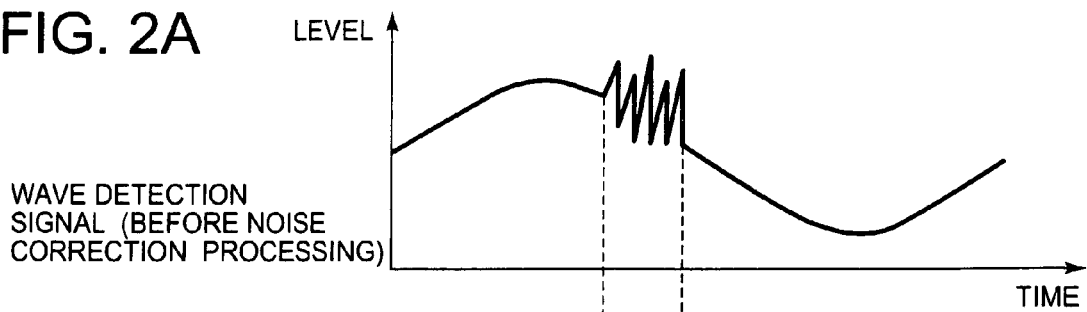
FIGS. 2A to 2F each show a timing diagram of the noise removal device according to Embodiment 1.

Preferred embodiments of the present invention will be described below. The following descriptions are given to describe the embodiments of the present invention, which however do not limit the present invention. To give clear descriptions, some parts of the following descriptions and the drawings are omitted or simplified as appropriate. Further, for clear descriptions, repeated descriptions are avoided as necessary. Note that, in the drawings, the same elements bear the same reference numerals, and repeated descriptions are avoided when appropriate.

Embodiment 1

Using FIG. 1, a description will be given first of the configuration of a noise removal device according to Embodiment 1. FIG. 1 is a block diagram showing the configuration of the noise removal device according to Embodiment 1. In FIG. 1, the noise removal device according to Embodiment 1 includes a wave detector 10, a noise detector 20, an interpolation controller 30, a delayer 40, and a noise gate processor 50.

An intermediate frequency (IF) signal 100 for a radio receiver is supplied to the wave detector 10 and to the noise detector 20. The wave detector 10 detects (demodulates) the IF signal 100, and extracts a wave detection signal 110 therefrom. At this time, the wave detector 10 also enhances noise components included in the IF signal 100.

The delayer 40 receives the wave detection signal 110 and delays it for a given length of time, and outputs a delay signal 140. The delayer 40 is provided to compensate for time necessary for preparation for noise correction processing to be described later.

The noise detector 20 detects a noise event in the IF signal 100 by extracting a drastic change in the IF signal 100. Then, the noise detector 20 outputs a noise detection signal 120.

Base on the wave detection signal 110 outputted from the wave detector 10 and on the noise detection signal 120 outputted from the noise detector 20, the interpolation controller 30 performs interpolation control for performing the noise correction processing. Specifically, the interpolation controller 30 determines an interpolation period and an amount of interpolation to be performed in that interpolation period. Then, the interpolation controller 30 outputs the thus-determined interpolation period as a noise gate signal 132, and outputs the thus-determined interpolation amount as interpolation amount data 139.

In Embodiment 1, when a noise event is detected in the IF signal 100, the interpolation controller 30 sets a first interpolation period, and determines an amount of interpolation to be performed to correct the noise in the thus-set interpolation period by using the linear interpolation scheme. Then, when a new noise event is detected within the set first interpolation period, the interpolation controller 30 redefines an interpolation period, and determines an amount of interpolation to be performed to correct the noise in that newly-set interpolation period by using the previous-value hold scheme. In this way, the schemes for performing the noise correction processing are switched before and after the redefining of the interpolation period. More precisely, the interpolation controller 30 performs control such that the linear interpolation scheme may be used before the redefining of the interpolation period, and the previous-value hold scheme may be used after the redefining thereof to perform the noise correction processing. A detailed description will be given later of the configuration of the interpolation controller 30.

The noise gate processor 50 performs the noise correction processing on the delay signal 140, based on the noise gate signal 132 and the interpolation amount data 139 supplied from the interpolation controller 30. For example, the noise correction processing is performed as follows. The gate of the noise gate processor 50 is driven by the noise gate signal 132, and the delay signal 140 is blocked from passing through the noise gate processor 50. While blocking the delay signal 140, the noise gate processor 50 performs interpolation on the delay signal 140 based on the interpolation amount data 139. Then, the signal thus subjected to interpolation is outputted as an audio signal 150. While the noise correction processing is not performed, the gate of the noise gate processor 50 is not driven, so that the delay signal 140 is outputted as the audio signal 150 without being corrected.

Next, a detailed description will be given of the configuration of the interpolation controller 30. As shown in FIG. 1, the interpolation controller 30 includes an interpolation amount calculator 31, a gate signal elongating unit 32, a noise interval detector 33, and a multiplexer (MUX) 39.

The noise detection signal 120 from the noise detector 20 is supplied to the gate signal elongating unit 32 and to the noise interval detector 33. Then, based on the noise detection signal 120, the gate signal elongating unit 32 defines an interpolation period for removing the noise included in the IF signal 100, and generates the noise gate signal 132. The interpolation period is set to a predetermined value in advance based on the estimation of the noise components to be enhanced by the wave detector 10. Accordingly, the gate signal elongating unit 32 elongates the supplied noise detection signal 120 over the predetermined period, and thus generates the noise gate signal 132. In other words, the gate signal elongating unit 32 outputs the noise gate signal 132 in response to the noise detection signal 120 received when not outputting the noise gate signal 132.

Further, the gate signal elongating unit 32 redefines an interpolation period upon receipt of a noise interval detection signal 133, indicating detection of a new noise event, from the noise interval detector 33 to be described later. Specifically, in response to the noise interval detection signal 133, the gate signal elongating unit 32 elongates the outputting noise gate signal 132 further by the predetermined period.

Once the noise detector 20 detects a new noise event within the interpolation period defined by the noise gate signal 132, the noise interval detector 33 outputs the noise interval detection signal 133 indicating detection of a new noise event.

Based on the wave detection signal 110 supplied from the wave detector 10, the interpolation amount calculator 31 calculates an interpolation amount, and then outputs calculation data 131 thus calculated. The timing to calculate the interpolation amount can be set to any timing. In other words, repeatedly at a predetermined time interval, the interpolation amount calculator 31 calculates an amount of interpolation for noise correction in the predetermined interpolation period by using the linear interpolation scheme. Then, as the calculation data 131, the interpolation amount calculator 31 outputs, for example, an inclination of a straight-line used for the linear interpolation, or the like.

The MUX 39 selects either the calculation data 131 or 0 based on the noise interval detection signal 133 from the noise internal detector 33, and then outputs the selection as the interpolation data 139. Specifically, the MUX 39 selects the calculation data 131 when not receiving the noise interval detection signal 133, and selects 0 when receiving the noise interval detection signal 133. In other words, when the noise detector 20 detects a new noise event within the interpolation period defined by the noise gate signal 132, the MUX 39 nullifies the calculation data 131 obtained by the interpolation amount calculator 31, and transmits 0 to the noise gate processor 50 as the interpolation amount data 139. Thereby, the previous-value hold scheme in which the inclination of a straight-line is 0 is selected. As described, the MUX 39 functions as an interpolation scheme selector selecting either the linear interpolation scheme or the previous-value hold scheme.

As has been described, in Embodiment 1, when a noise event is detected, the interpolation controller 30 defines an interpolation period and performs control such that the linear interpolation scheme may be used to perform the noise correction processing on the signal within the defined interpolation period. Then, when the noise detector 20 detects a new noise event within the defined interpolation period, the interpolation controller 30 redefines an interpolation period and performs control such that the previous-value hold scheme may be used to perform the noise correction processing on the signal within the redefined interpolation period.

Next, using FIGS. 2A to 2F, a description will be given of the operation of the noise removal device according to Embodiment 1. FIGS. 2A to 2F each show a timing diagram of the noise removal device according to Embodiment 1.

Figure 2B:

Upon supply of the IF signal 100 including the modulated wave detection signal 110, the noise detector 20 detects a noise event as shown in FIG. 2A. The detection signal 120 shown in FIG. 2B is thus obtained. Assume here that five noise detection signals 120, for example, are outputted as shown in FIG. 2B.

Once the gate signal elongating unit 32 receives the noise detection signals 120, a start point and an end point of an interpolation period is defined based on the first noise detection signal 120. Thus, the noise gate signal 132 shown in FIG. 2C is outputted.

Figure 2C:
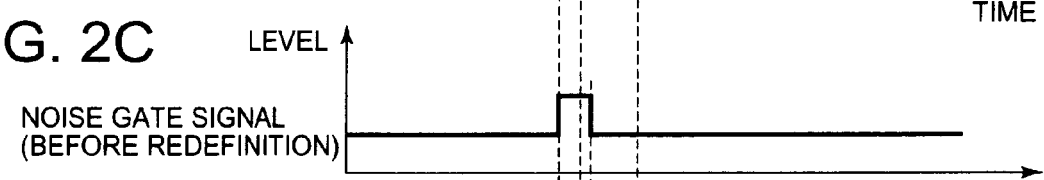
Figure 2D:

Once the noise interval detector 33 detects the second noise detection signal 120 within the interpolation period, shown in FIG. 2C, defined based on the first noise detection signal 120, the noise interval detection signal 133 shown in FIG. 2D is outputted. Then, upon receipt of the noise interval detection signal 133, the gate signal elongating unit 32 extends output of the noise gate signal 132 shown in FIG. 2C by the predetermined period. Specifically, the noise gate signal 132 is extended by the predetermined interpolation period from the point when the noise interval detection signal 133 is inputted. As a consequence, the noise gate signal 132 employs, as an end point of the interpolation period, the end point of the interpolation period redefined based on the first noise interval detection signal 133 outputted in response to the second noise detection signal 120, instead of the end point of the interpolation period defined based on the first noise detection signal 120.

Once the noise interval detector 33 detects the third noise detection signal 120 within the redefined interpolation period, the second noise interval detection signal 133 is outputted. Then, upon receipt of the second noise interval detection signal 133, the gate signal elongating unit 32 redefines an interpolation period again and extends output of the noise gate signal 132 further by the predetermined period. In this way, redefinition of the interpolation period is repeatedly performed every time a noise event is detected within the interpolation period.

Figure 2E:
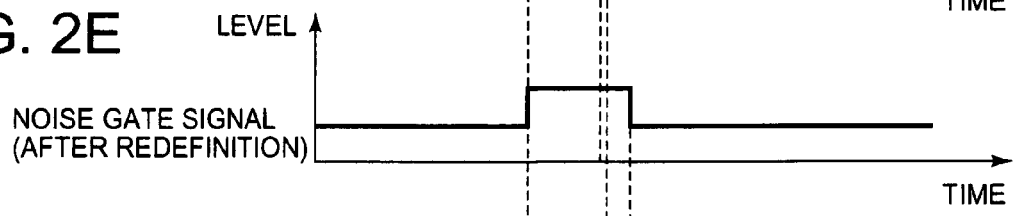

When there is no longer any noise event detected within the interpolation period, redefinition of the interpolation period is not performed. Therefore, the output of the noise gate signal 132 is finished at the endpoint of the interpolation period redefined finally. Accordingly, the final interpolation period outputted as the noise gate signal 132 is as shown in FIG. 2E which is obtained by the redefinition based on the fourth noise interval detection signal 133.

Figure 2F:
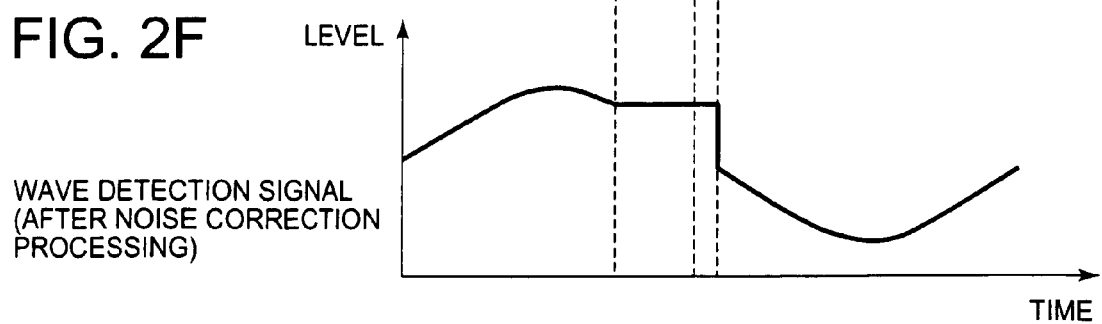

In the above series of operation, an end point of the interpolation period is redefined when a new noise event is detected within the interpolation period. Thereby, the calculation data 131 obtained by the interpolation amount calculator 31 is nullified. Consequently, the previous-value hold scheme is selected for the noise correction processing. As a result, the wave detection signal 110 having been subjected to the noise correction processing by the noise gate processor 50, namely, the audio signal 150 has a waveform, as shown in FIG. 2F, in which a value at the start point of the interpolation period for the noise correction processing is held to the end point. Note that the redefinition of the interpolation period is not performed when no new noise event is detected within the interpolation period defined based on the first noise detection signal 120, namely, when the second noise detection signal 120 shown in FIG. 2B is detected after the completion of output of the noise gate signal 132 shown in FIG. 2C, for example. In this case, the linear interpolation scheme is selected for the noise correction processing.

Figure 9A:
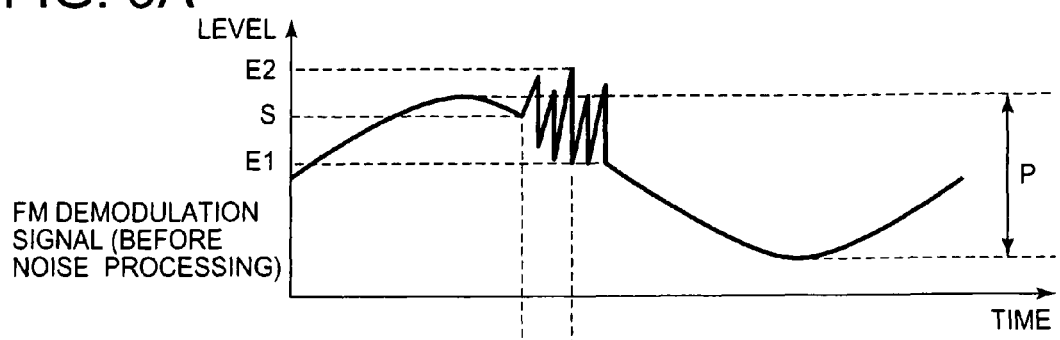
FIGS. 9A to 9D are timing diagrams explaining a problem with the conventional noise removal device.
Figure 9B:
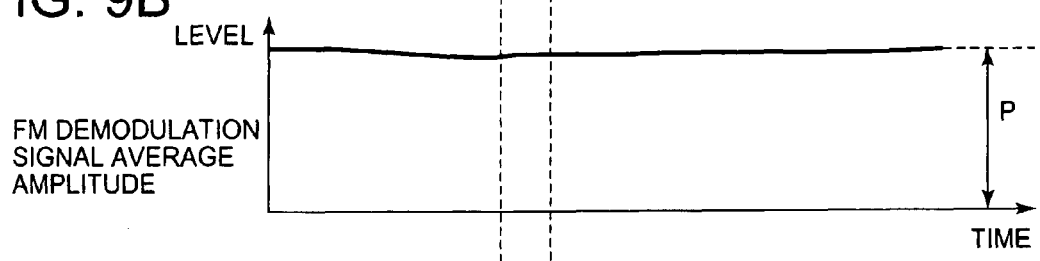
Figure 9C:
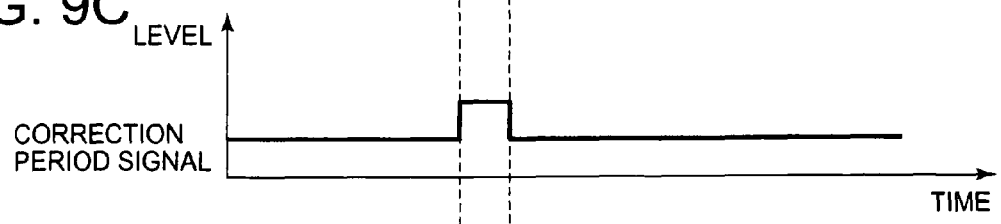
Figure 9D:

As described, in Embodiment 1, which interpolation scheme to select for the noise correction processing is determined depending on whether or not a new noise event is detected within an interpolation period firstly defined. In the conventional technique, when pulse noise having small amplitude is included in an input signal, the linear interpolation scheme is selected, which might cause a large correction error as shown in FIG. 9D. In Embodiment 1, on the other hand, the previous-value hold scheme is selected in such a case, so that the correction error can be made small. Therefore, noise can be properly corrected irrespective of magnitude thereof, so that more proper interpolation can be performed on the input signal.

FIGS. 3A to 3I each show another timing diagram of the noise removal device according to Embodiment 1. A description will be given of the operation of the noise removal device according to Embodiment 1, performed when the wave detection signal 110 includes pulse noise events successively at a short interval as shown in FIG. 3A. FIG. 3B shows a waveform diagram obtained by enlarging the portion IIIB in FIG. 3A. The noise correction processing is performed as follows when the interval between the two pulse noise events is very similar to an interpolation period set in advance, and is the same as or shorter than the interpolation period.

Upon receipt of the IF signal 100, the noise detector 20 detects noise events, for each of which the noise detection signal 120 shown in FIG. 3C is obtained. Once the first noise detection signal 120 is inputted, the gate signal elongating unit 32 first defines a start point and an end point of an interpolation period based on the first noise detection signal 120, and then outputs the noise gate signal 132 as shown in FIG. 3D. While the noise gate signal 132 shown in FIG. 3D is being outputted, the noise interval detector 33 outputs the noise interval detection signal 133 shown in FIG. 3E indicating the presence of the second noise detection signal 120. Then, the gate signal elongating unit 32 redefines an interpolation period, and extends output of the noise gate signal 132 as shown in FIG. 3F by the predetermined interpolation period from a point when the noise interval detection signal 133 is inputted.

As a result, the interpolation period shown in FIG. 3H is applied to the wave detection signal 110, shown in FIG. 3G, having been subjected to the delay processing, namely, the delay signal 140. Also in the above series of operation, the endpoint of the interpolation period is redefined when a new noise event is detected within the interpolation period. Thereby, the calculation data 131 obtained by the interpolation amount calculator 31 is nullified. Consequently, the previous-value hold scheme is selected for the noise correction processing. As a result, the wave detection signal 110 having been subjected to the noise correction processing by the noise gate processor 50, namely, the audio signal 150 has a waveform, as shown in FIG. 3I, in which a value at the start point of the interpolation period for the noise correction processing is held to the end point.

Figure 10A:
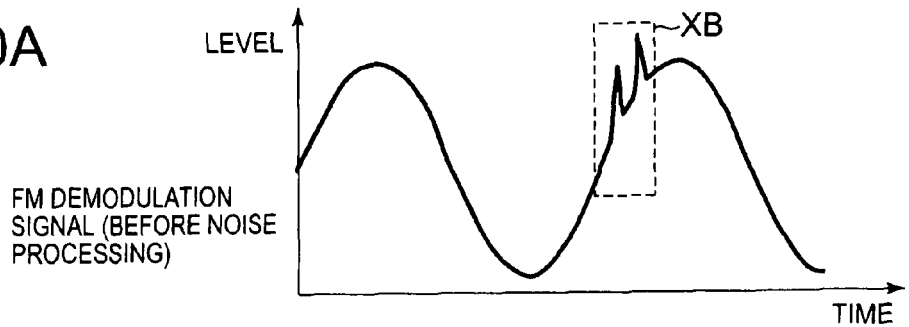
FIGS. 10A to 10H are timing diagrams explaining another problem with the conventional noise removal device.
Figure 10B:
Figure 10C:
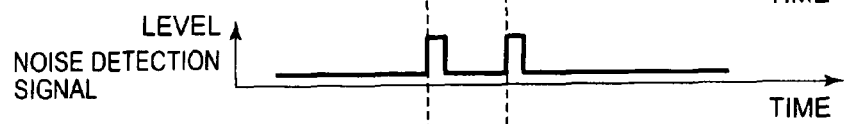
Figure 10D:
Figure 10E:
Figure 10F:
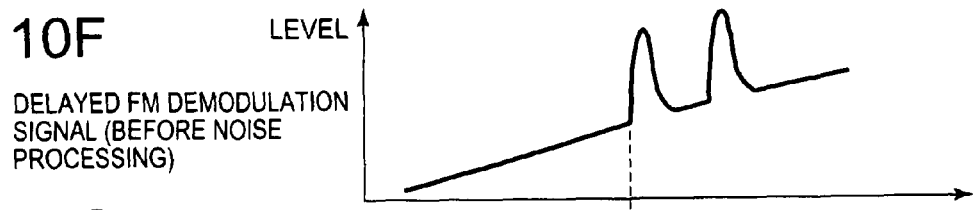
Figure 10G:
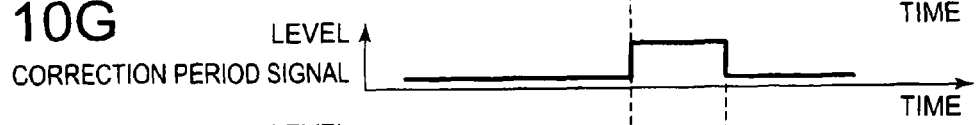
Figure 10H:
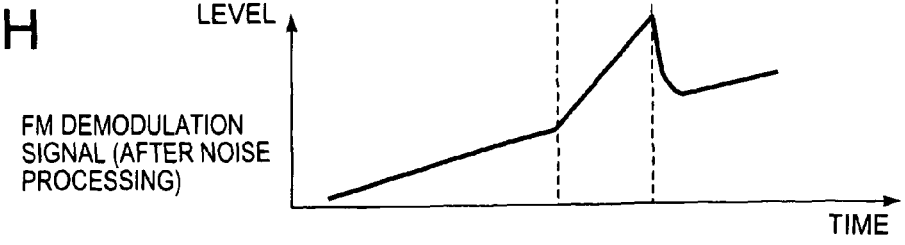

With the conventional technique, when an input signal includes pulse noise events successively at a short interval, the linear interpolation scheme is selected, which might cause a large correction error as shown in FIG. 10H. In Embodiment 1, on the other hand, as described above, the previous-value hold scheme is selected, so that the correction error can be made small. Therefore, noise can be properly corrected irrespective of an interval therebetween, so that more proper interpolation can be performed on the input signal.

In addition, in Embodiment 1, when a new noise event is detected within the interpolation period, a proper interpolation period is set by redefining an interpolation period. Accordingly, although with the conventional technique, the large correction error might be caused by a noise level present at the end point of the interpolation period as shown in FIG. 9D, no noise level is present at the end point of the interpolation period in Embodiment 1. This makes the correction error smaller. Therefore, a proper interpolation period can be obtained to properly correct the noise. As a result, proper interpolation can be performed on the input signal. As has been described, the noise removal device according to Embodiment 1 makes it possible to suppress audio quality deterioration which would be caused by high-frequency pulse noise events generated due to a door mirror, a hazard flasher, and the like.

Embodiment 2

Figure 4:
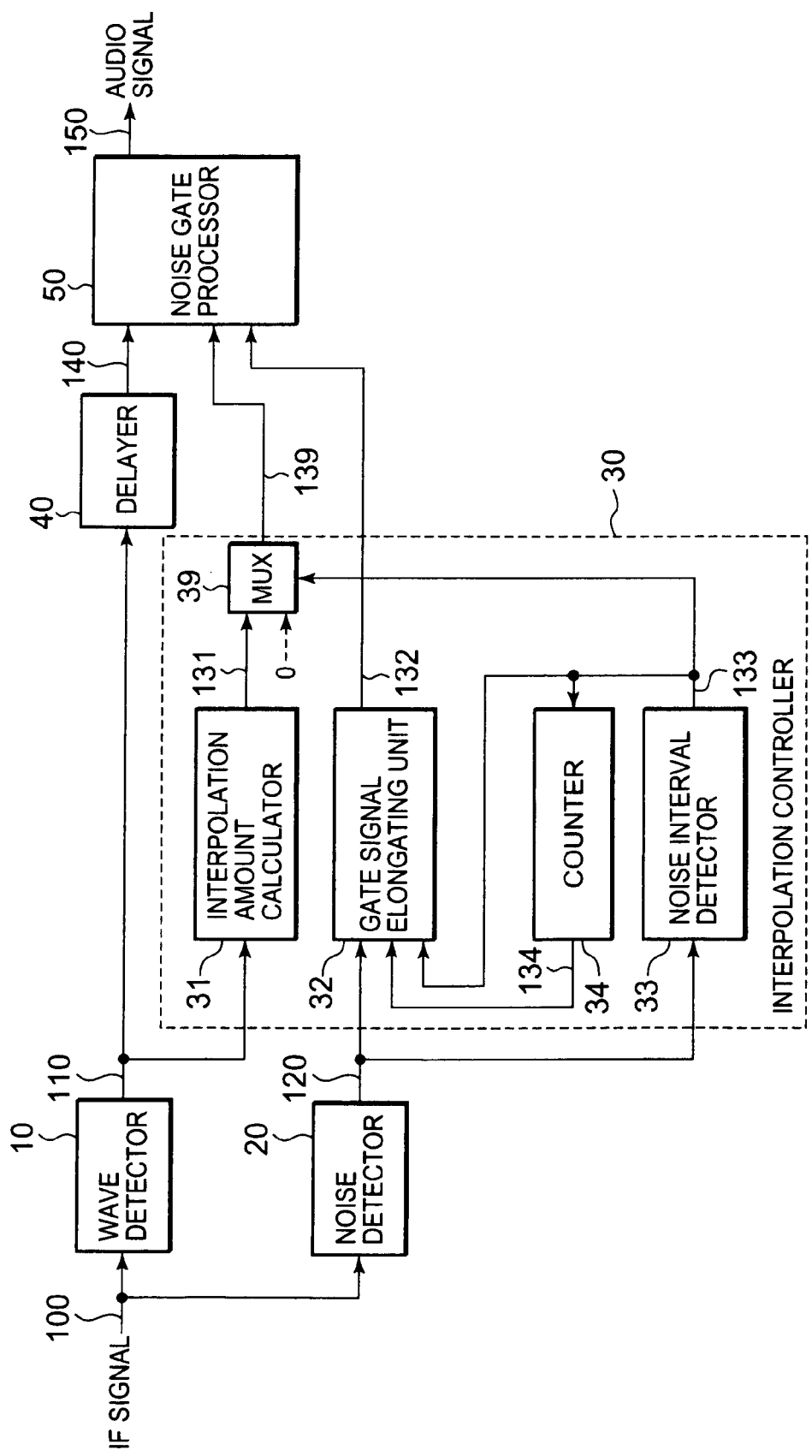
FIG. 4 is a block diagram showing the configuration of a noise removal device according to Embodiment 2.

Using FIG. 4, a description will be given of a noise removal device according to Embodiment 2. FIG. 4 is a block diagram showing the configuration of the noise removal device according to Embodiment 2. The configuration of the interpolation controller 30 of Embodiment 2 is different from that of Embodiment 1. As other configurations are the same as Embodiment 1, their descriptions will be omitted.

In FIG. 4, the interpolation controller 30 of the noise removal device according to Embodiment 2 further includes a counter 34. The counter 34 disables the operation of redefining the interpolation period when a count value of noise detection within the interpolation period reaches a certain value. In other words, when the number of the noise interval detection signals 133 inputted into and counted by the counter 34 reaches a predetermined count value, the counter 34 outputs a disabling signal 134 for causing the gate signal elongating unit 32 not to perform the interpolation period redefinition according to the noise interval detection signal 133. Any value can be set as the predetermined count value based on which the counter 34 outputs the disabling signal 134.

Upon receipt of the disabling signal 134, the gate signal elongating unit 32 resets redefinition. Specifically, the gate signal elongating unit 32 first outputs, as the noise gate signal 132, an interpolation period redefined based on the noise interval detection signal 133 inputted before the number of the noise interval detection signals 133 has reached the predetermined count value. Then, the gate signal elongating unit 32 lowers the level for outputting the noise gate signal 132. In response to detection of a first noise event after that, the noise detection signal 120 is outputted as a first noise detection signal. Upon receipt of the first noise detection signal 120, the gate signal elongating unit 32 outputs the noise gate signal 132. When the output level is lowered, the counter value of the counter 34 is also reset.

As described above, in Embodiment 2, the counter 34 resets redefinition of the interpolation period when the number of the noise interval detection signals 133 reaches the predetermined count value. Without the counter 34, if high frequency pulse noise events existing successively for a very long time period are detected, a value obtained at the time of starting correction processing and used for redefinition of the interpolation period has to be retained continuously for that long period of time. However, with the counter 34, such continuous retaining of the value can be prevented. Accordingly, a continuous operation for redefining the interpolation period is limited, which can avoid a silent state caused by the audio signal 150 not being transmitted. As a consequence, proper interpolation can be performed on the input signal.

Embodiment 3

Figure 5:
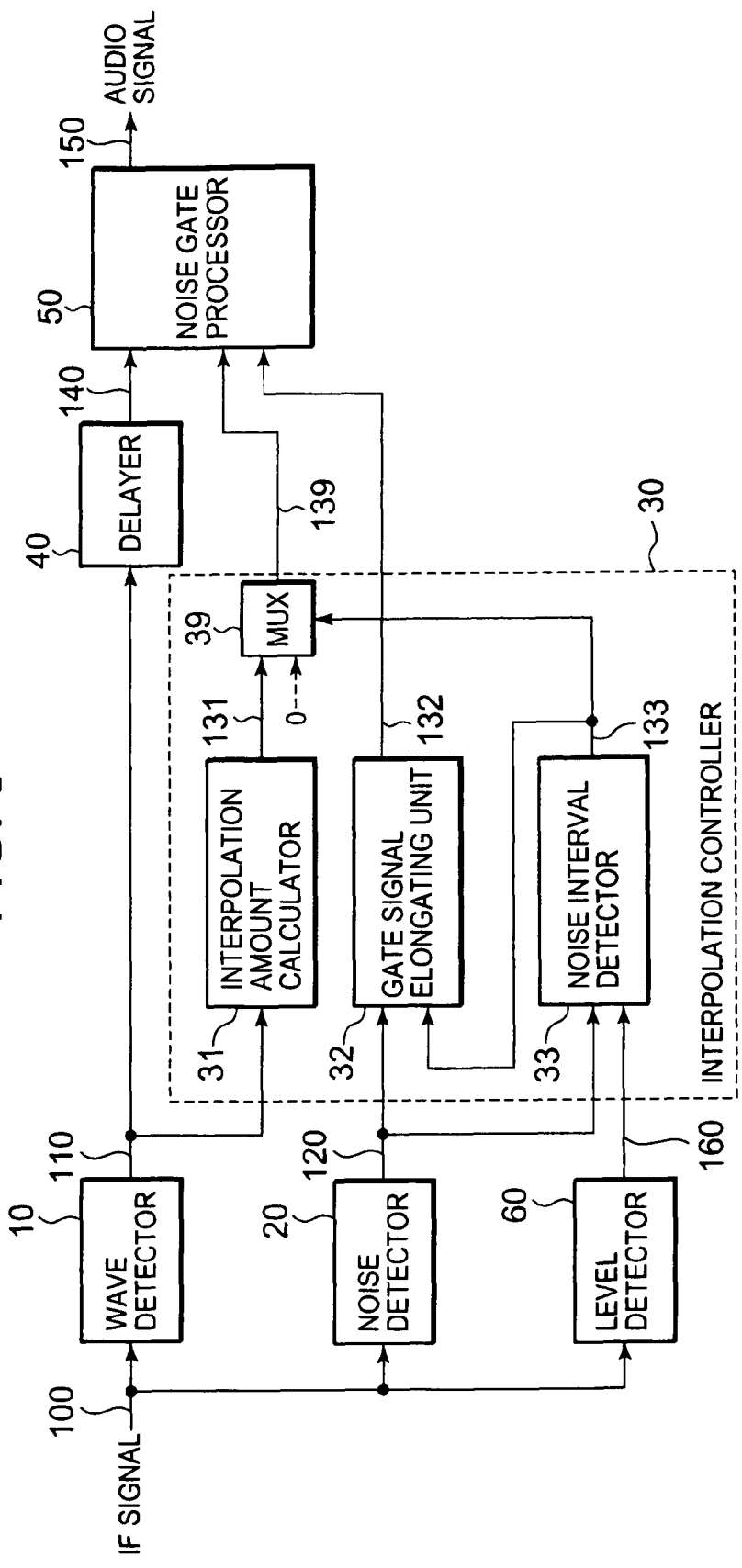
FIG. 5 is a block diagram showing the configuration of a noise removal device according to Embodiment 3.
Figures 6A, 6B:
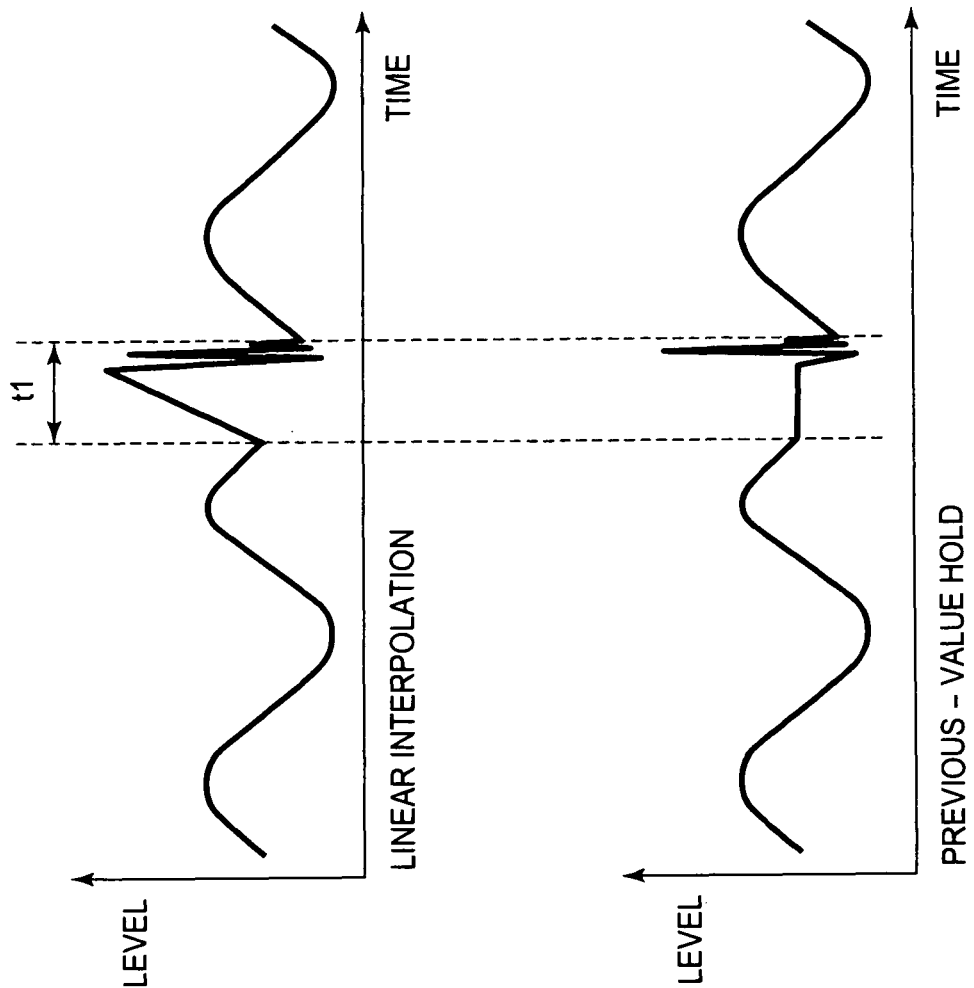
FIGS. 6A and 6B show noise correction performed when an interpolation period signal is short, the noise correction performed by using a linear interpolation scheme and by using a previous-value hold scheme, respectively.

Using FIG. 5, a description will be given of a noise removal device according to Embodiment 3. When interpolation is performed on the IF signal 100 having rather high amplitude, the use of the previous-value hold scheme may cause a large step of difference in noise level at the endpoint of the interpolation period. This rather deteriorates the audio quality. In this respect, the noise removal device of Embodiment 3 is configured so that the linear interpolation scheme can be selected depending on the level of the input signal. FIG. 5 is a block diagram showing the configuration of the noise removal device according to Embodiment 3. The noise removal device of Embodiment 3 has a configuration in which a level detector 60 is further included in the configuration of Embodiment 1. As other configurations are the same as Embodiment 1, their descriptions will be omitted.

In FIG. 5, the IF signal 100 is supplied to the wave detector 10, to the noise detector 20, and to the level detector 60. Depending on the level of the IF signal 100, the level detector 60 nullifies detection performed by the noise interval detector 33. Specifically, the level detector 60 detects the level of the IF signal 100. Then, when the level thus detected is larger than a predetermined level being any selected level, the level detector 60 outputs a nullification signal 160 for causing the noise interval detector 33 not to output the noise interval detection signal 133.

Even if a new noise event is detected within an interpolation period, the noise interval detector 33 does not output the noise interval detection signal 133 while receiving the nullification signal 160. Accordingly, the gate signal elongating unit 32 does not redefine the interpolation period, but outputs the noise gate signal 132 as a predetermined interpolation period, and then lowers the level for outputting the noise gate signal 132. Then, in response to detection of a first noise event after that, the noise detection signal 120 is outputted as a first noise detection signal. Upon receipt of the first noise detection signal 120, the gate signal elongating unit 32 outputs the noise gate signal 132 as the predetermined interpolation period. Thereafter, the gate signal elongating unit 32 again lowers the level for outputting the noise gate signal 132. In this way, the gate signal elongating unit 32 repeatedly outputs the noise gate signals 132 for the predetermined interpolation periods while the nullification signal 160 is inputted to the noise interval detector 33. Since these interpolation periods are not redefined, the linear interpolation scheme is selected. As a result, the audio signal 150 having been subjected to the noise correction processing by the noise gate processor 50 has a waveform in which the start point and the end point of the interpolation period are connected.

As has been described, the noise removal device of Embodiment 3 further includes the level detector 60, so that when the level of the IF signal 100 is higher than the predetermined level, the linear interpolation scheme is selected independent of whether or not a new noise event is detected within the interpolation period. Thereby, the step of difference in noise level caused at the end point of the interpolation period can be made small, so that the audio deterioration can be suppressed. As a consequence, proper interpolation can be performed on the input signal. Note that the configurations of Embodiments 2 and 3 may be combined.

The above descriptions have been given to describe the embodiments of the present invention, which do not limit the present invention. In addition, those skilled in the art can easily perform modification, addition, and conversion on the elements of the above-described embodiments within the scope of the present invention.

What is claimed is:

1. A noise removal device for removing noise included in an input signal, the noise removal device comprising:
  a noise detector that detects noise in the input signal and outputs a noise detection signal;

an interpolation controller that determines a period an amount of interpolation for a noise correction processing, based on the input signal and the noise detection signal; and a noise gate processor that performs the noise correction processing on the input signal, based on the interpolation period and the interpolation amount supplied from the interpolation controller, wherein the interpolation controller sets a predetermined first interpolation period as the interpolation period, based on a first noise detection signal inputted from the noise detector, and redefines a second interpolation period longer the first interpolation period as the interpolation period when a second noise detection signal is detected within the first interpolation period, wherein the interpolation controller includes:

a gate signal elongating unit that generates a noise gate signal for the first interpolation period by elongating the noise detection signal;

a noise interval detector that detects output of the second noise detection signal within the first interpolation period, and outputs a noise interval detection signal;

an interpolation amount calculator that calculates an amount of interpolation for noise correction within the first interpolation period by using a linear interpolation scheme; and an interpolation scheme selector that selects any one of the linear interpolation scheme and a previous-value hold scheme depending on the noise interval detection signal, and the interpolation scheme selector selects the linear interpolation scheme when not receiving the noise interval detection signal, and selects the previous-value hold scheme when receiving the noise interval detection signal, and wherein upon receipt of the noise interval detection signal, the gate signal elongating unit generates the noise gate signal for the second interpolation period by extending the first interpolation period.

2. The noise removal device according to claim 1, wherein when the noise interval detector detects an output of a third noise detection signal within the second interpolation period and further outputs the noise interval detection signal, the gate signal elongating unit redefines a third interpolation period longer than the second interpolation period as the interpolation period.

3. The noise removal device according to claim 2, wherein the interpolation controller further includes a counter that counts a number of the noise interval detection signals, and that outputs a redefining disabling signal when the number of counts reaches a predetermined count value, and the gate signal elongating unit disables an operation of redefining of the interpolation period in response to the redefining disabling signal.

4. The noise removal device according to claim 1, further comprising a level detector that detects a level of the input signal, wherein when the detected level of the input signal is larger than a predetermined level, the noise interval detector does not output the noise interval detection signal.

5. A noise removal method of removing noise included in an input signal, the noise removal method comprising:

detecting noise in the input signal and outputting a noise detection signal;

generating a noise gate signal for a predetermined interpolation period by elongating the noise detection signal;

redefining the interpolation period and generating the noise gate signal for the redefined interpolation period when a new noise detection signal is detected while the noise gate signal is being outputted; and performing noise correction processing on the input signal in accordance with the interpolation period and an interpolation amount determined based on the interpolation period, wherein the noise correction processing is performed by using a linear interpolation scheme when the interpolation period is not redefined, and by using a previous-value hold scheme when the interpolation period is redefined.

6. The noise removal method according to claim 5, wherein an operation of redefining of the interpolation period is disabled when a number of times that the interpolation period is redefined reaches a predetermined value.

7. The noise removal method according to claim 5, wherein when a level of the input signal is higher than a predetermined level, an operation of redefining of the interpolation period is disabled.

* * * * *